US008361848B2

(12) United States Patent
Lee et al.

(10) Patent No.: US 8,361,848 B2
(45) Date of Patent: Jan. 29, 2013

(54) PRECISE RESISTOR ON A SEMICONDUCTOR DEVICE

(75) Inventors: Da-Yuan Lee, Jhubei (TW); Matt Yeh, Hsinchun (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 232 days.

(21) Appl. No.: 12/770,166

(22) Filed: Apr. 29, 2010

(65) Prior Publication Data

US 2011/0266637 A1    Nov. 3, 2011

(51) Int. Cl.
*H01L 51/00* (2006.01)

(52) U.S. Cl. .................. 438/171; 438/190; 438/510

(58) Field of Classification Search .............. 438/171, 438/190, 210, 238, 329, 330, 332, 381, 382, 438/383, 384, 488, 491, 764, 208, 912, 510, 438/514; 257/359, 380, 385, 538, 581, 904, 257/E29.325–E29.346
See application file for complete search history.

(56) References Cited

U.S. PATENT DOCUMENTS

| | | | |
|---|---|---|---|
| 6,027,965 A * | 2/2000 | Stucchi et al. | 438/238 |
| 7,049,241 B2 * | 5/2006 | Schroeder et al. | 438/705 |
| 2005/0095779 A1 * | 5/2005 | Park et al. | 438/238 |
| 2007/0166890 A1 * | 7/2007 | Cheng et al. | 438/149 |
| 2007/0218661 A1 * | 9/2007 | Shroff et al. | 438/510 |
| 2008/0142839 A1 * | 6/2008 | Fukutome et al. | 257/190 |
| 2009/0233433 A1 * | 9/2009 | Yamada et al. | 438/592 |
| 2009/0242997 A1 * | 10/2009 | Yu et al. | 257/379 |
| 2010/0019328 A1 * | 1/2010 | Zhang et al. | 257/380 |
| 2010/0078645 A1 * | 4/2010 | Kurz et al. | 257/66 |

OTHER PUBLICATIONS

Da-Yuan Lee et al., Unpublished U.S. Appl. No. 12/639,630 filed Dec. 16, 2009 entitled "Method of Fabricating High-K/Metal Gate Device", 25 pages.

Kuang-Yuan Hsu et al., Unpublished U.S. Appl. No. 12/649,555 filed Dec. 30, 2009 entitled "Method to Form a Semiconductor Device Having Gate Dielectric Layers of Varying Thickness", 32 pages.

* cited by examiner

*Primary Examiner* — Cuong Q Nguyen
*Assistant Examiner* — Yosef Gebreyesus
(74) *Attorney, Agent, or Firm* — Haynes and Boone, LLP

(57) ABSTRACT

A method includes forming a polysilicon layer on a substrate; and patterning the polysilicon layer to form a polysilicon resistor and a polysilicon gate. A first ion implantation is performed on the polysilicon resistor to adjust electric resistance of the polysilicon resistor. A second ion implantation is performed on a top portion of the polysilicon resistor such that the top portion of the polysilicon resistor has an enhanced etch resistance. An etch process is then used to remove the polysilicon gate while the polysilicon resistor is protected by the top portion.

20 Claims, 13 Drawing Sheets

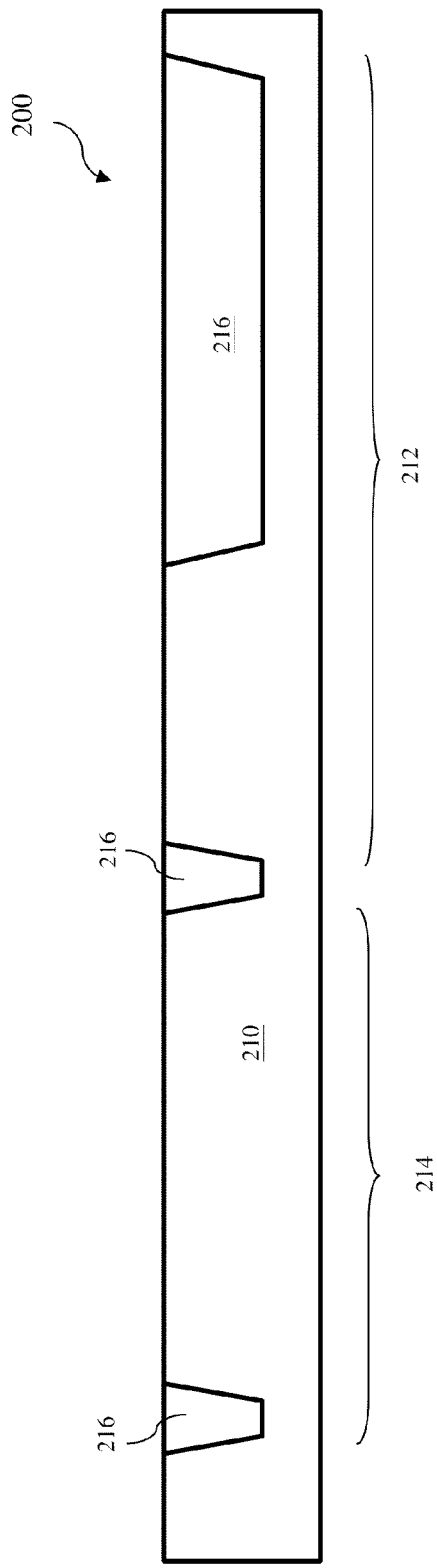
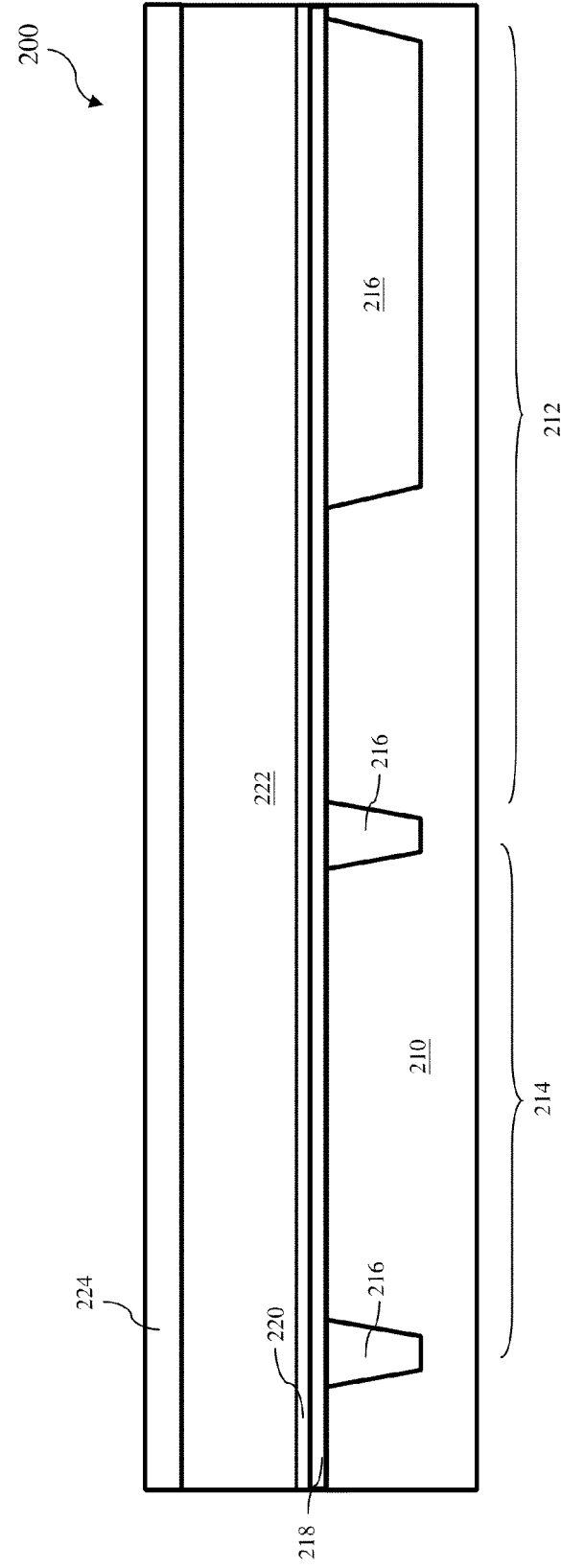

US 8,361,848 B2

PRECISE RESISTOR ON A SEMICONDUCTOR DEVICE

BACKGROUND

Polysilicon resistors have been frequently used in conventional integrated circuit (IC) design. Likewise, due to shrinking technology nodes, high-k dielectric material and metal are often considered to form a gate stack for a semiconductor device such as a metal-oxide-semiconductor field-effect transistor (MOSFET). However, various integration issues exist when combining polysilicon resistors and metal-gate MOSFETs onto a single IC chip. One solution is to utilize a dummy gate when forming a polysilicon resistor. A gate replacement process, such as an etch process, can then be implemented to remove the dummy gate. However, the formed polysilicon resistors can be damaged and recessed by the etch process, causing the deviation of the resistance of the polysisilcon resistor from the designed target and other problems. Therefore, a polysilicon resistor structure and a method making the same are needed to address the above issues.

SUMMARY

The present disclosure provides a method of making an integrated circuit, the method includes forming a polysilicon layer on a substrate; and patterning the polysilicon layer to form a polysilicon resistor and a polysilicon gate. A first ion implantation is performed on the polysilicon resistor to adjust electric resistance of the polysilicon resistor. A second ion implantation is performed on a top portion of the polysilicon resistor such that the top portion of the polysilicon resistor has an enhanced etch resistance. An etch process is then used to remove the polysilicon gate while the polysilicon resistor is protected by the top portion.

The present disclosure also provides another embodiment of a method making an integrated circuit. The method includes forming a high k dielectric material layer on a substrate and forming a polysilicon layer on the dielectric material layer. The high-k dielectric material layer and polysilicon layer are patterned to form a passive device and a polysilicon gate. An ion implantation is performed on a top portion of the polysilicon passive device, the top portion having an enhanced etch resistance. Afterwards, an etch process is performed to remove the polysilicon gate to form a gate trench while the polysilicon passive device is protected by the implanted top portion. The gate trench is then filled with a metal layer, forming a metal gate.

The present disclosure also provides an integrated circuit. In one embodiment, the integrated circuit includes a semiconductor substrate; a filed-effect transistor (FET) disposed in a first region of the semiconductor substrate; and a passive polysilicon device disposed in a second region of the semiconductor substrate. The FET includes a gate stack having a high k dielectric material layer, a metal layer having a proper work function and disposed on the high k dielectric material layer, and a conductive layer on the metal layer. The passive polysilicon device includes a polysilicon column feature having a boron-containing dopant of a first doping concentration; and a top polysiliocn portion disposed on the polysilicon column feature, wherein the top polysilicon portion includes the boron-containing dopant of a second doping concentration greater than the first doping concentration, and a thickness less than about 5 nm.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-9 are sectional views of one embodiment of a semiconductor structure having a metal gate stack and a polysilicon resistor at various fabrication stages constructed according to various aspects of the present disclosure.

DETAILED DESCRIPTION

Figure 1:
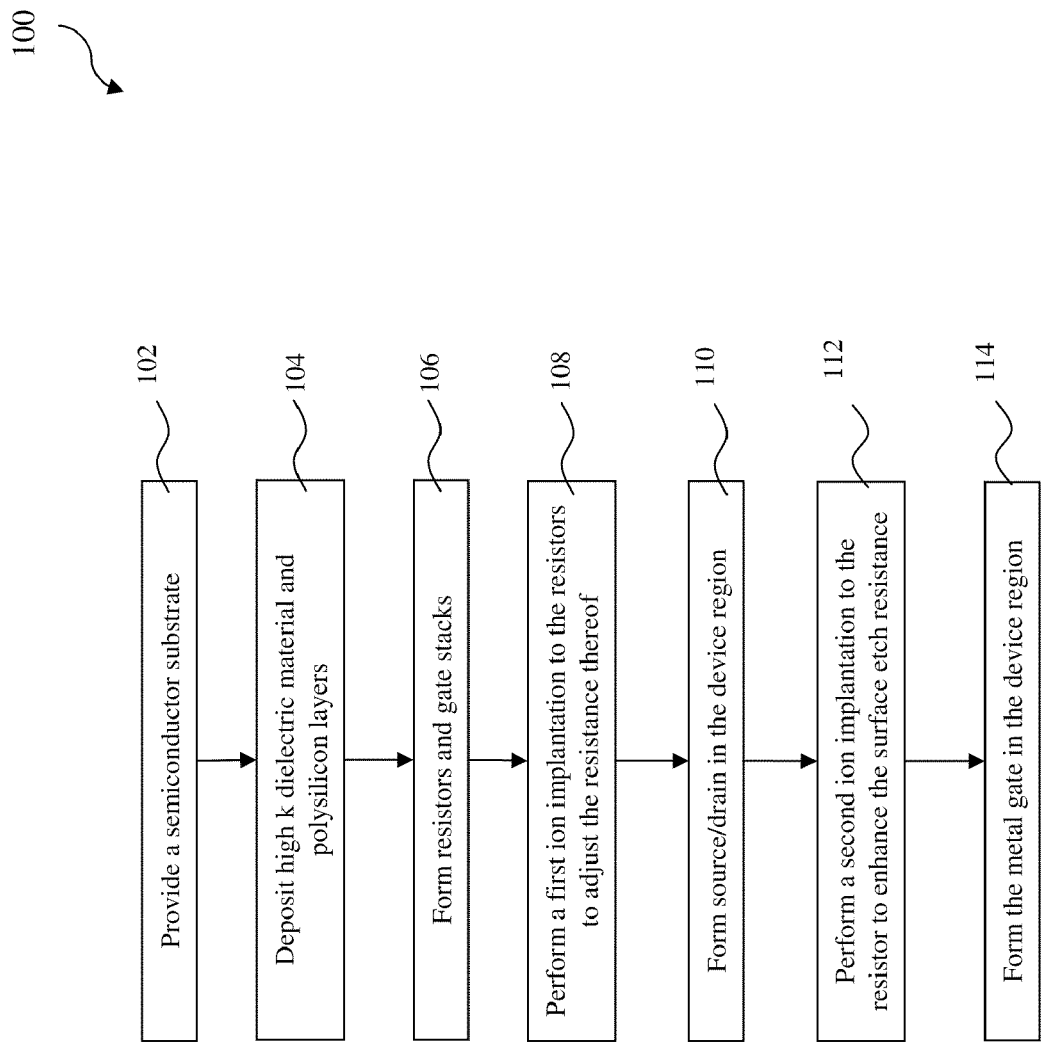
FIG. 1 is a flowchart of a method making a semiconductor device having a metal gate stack and a polysilicon resistor constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device according to one embodiment. The semiconductor device includes a metal gate stack and a polysilicon resistor constructed according to various aspects of the present disclosure. FIGS. 2 through 9 are sectional views of a semiconductor structure 200 at various fabrication stages and constructed according to one or more embodiments. The semiconductor structure 200 and the method 100 of making the same are collectively described with reference to FIGS. 1 through 11.

Referring to FIGS. 1 and 2, the method 100 begins at step 102 by providing a semiconductor substrate 210. The semiconductor substrate 210 includes silicon. Alternatively, the substrate includes germanium, silicon germanium or other proper semiconductor materials. The semiconductor substrate 210 also includes various isolation features such as shallow trench isolation (STI) formed in the substrate to separate various devices. The semiconductor substrate also includes various doped regions such as n-well and p-wells. In one embodiment, the semiconductor substrate 210 includes a first region (resistor region) 212 for one or more polysilicon resistors and a second region (device region) 214 for one or more field-effect transistors (FETs). Various STI features 216 are formed in the substrate 210. The formation of the STI features includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. In one embodiment, the STI feature is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. The semiconductor substrate 210 also includes various n-wells and p-wells formed in various active regions.

Referring to FIGS. 1 and 3, the method 100 proceeds to step 104 by forming gate material layers including a dielectric material layer 220 and a polycrystalline silicon (polysilicon) layer 222. In the present embodiment, the silicon layer 222 is non-doped and the dielectric material layer 220 includes a high-k dielectric material layer. The silicon layer 222 alternatively or additionally may include amorphous silicon. The high-k dielectric layer 220 includes a dielectric material having the dielectric constant higher than that of thermal silicon oxide, which is about 3.9. In one example, the high-k dielectric layer 220 includes hafnium oxide (HfO). In various examples, the high-k dielectric layer 220 includes metal oxide, metal nitride, or combinations thereof. In one example, the high-k dielectric layer 220 includes a thickness ranging between about 10 angstrom and about 100 angstrom.

In one embodiment, the gate material layers include multilayer dielectric materials, such as an interfacial layer 218 (e.g., silicon oxide) and a high k dielectric material layer 222 disposed on the interfacial layer. In another embodiment, a hard mask layer 224, such as silicon nitride (SiN) or silicon oxide (SiO2), is further formed on the gate material layers for gate patterning. In various embodiments, the interfacial layer 218 may be formed by chemical oxide technique, thermal oxide procedure, atomic layer deposition (ALD) or chemical vapor deposition (CVD). The high k dielectric material layer 220 may be formed by CVD, ALD, plasma enhanced CVD (PE CVD), or plasma enhanced ALD (PEALD). The non-doped amorphous silicon or polysilicon layer 222 can be formed using CVD with precursor silane (SiH4) or other silicon based precursor. The deposition of the non-doped amorphous silicon layer 222 can be performed at a raised temperature. In one example, the deposition temperature is greater than about 400° C. In another example, the deposition temperature is greater than about 530° C. The hard mask layer (SiN or SiO2) can be formed by CVD or other suitable technique.

Figure 4:
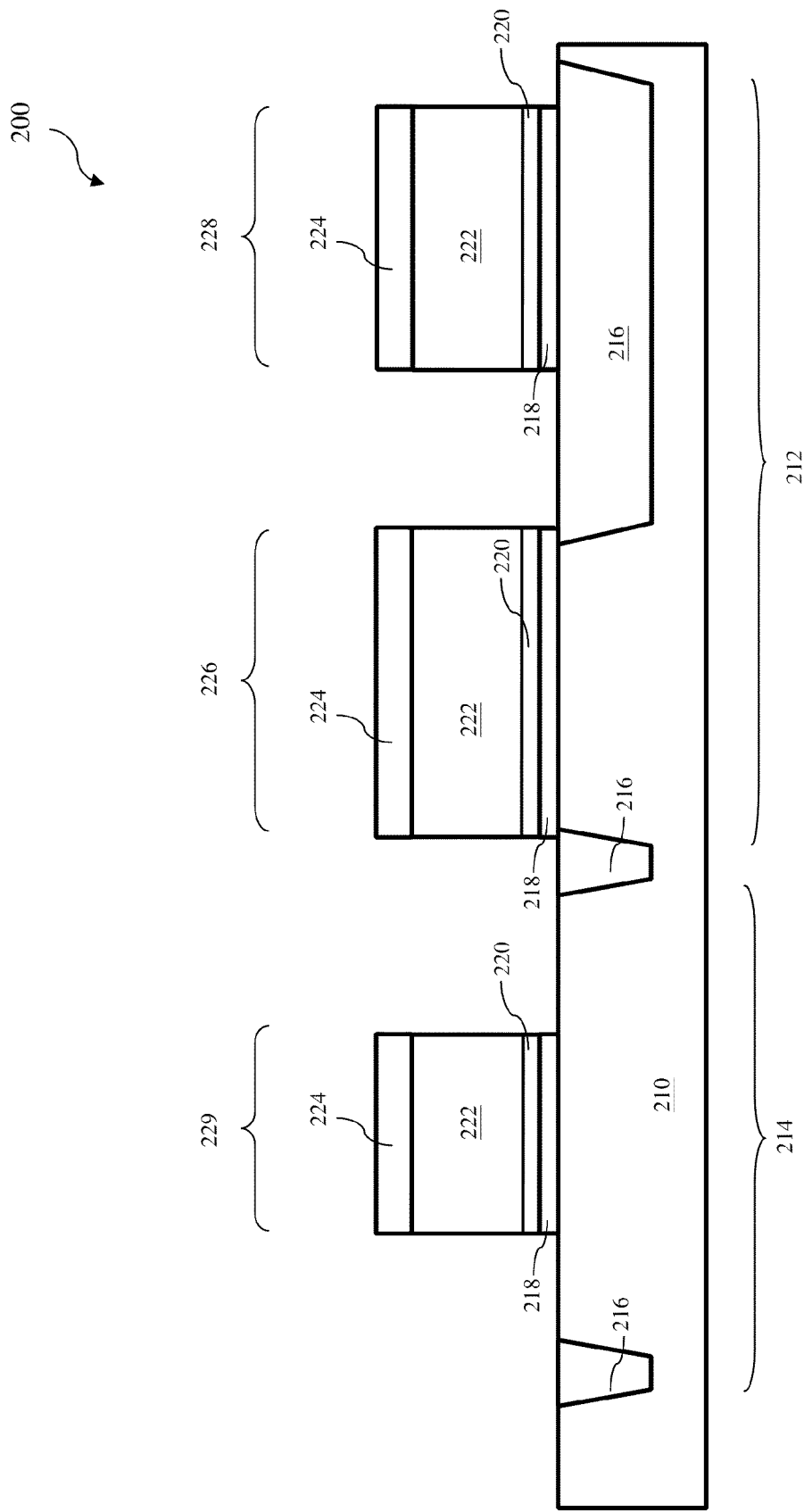

Referring to FIGS. 1 and 4, the method 100 proceeds to step 106 by patterning the gate material layers to form one or more resistors, such as resistors 226 and 228, and one or more gate stacks (or dummy gates), such as a gate stack 229. The patterning of the gate material layers can be achieved by a lithography process and/or an etch process. For example, a patterned photoresist layer is formed on the hard mask layer 224 defining various resistor regions and gate regions, using a photolithography process including photoresist coating, soft baking, exposing, post-exposure baking (PEB), developing, and hard baking. Then, the hard mask layer 224 is etched through the openings of the patterned photoresist layer, forming a patterned hard mask. The gate material layers are further etched using the patterned hard mask, forming the various resistors and gate stacks. The patterned photoresist layer is removed thereafter using a suitable process, such as wet stripping or plasma ashing. Alternatively, if the hard mask layer is not present, then the patterned photoresist layer is directly utilized as an etch mask to etch the gate material layers.

In one embodiment, the resistor 226 (or 228) is formed for a passive device. This passive device can be used for a resistor or alternatively used as a polysilicon fuse. In another embodiment, the resistor 228 is disposed on one STI feature 216. In another embodiment, the resistor 226 is substantially disposed in the active region of the substrate 210. Alternatively, a resistor can be partially on the active region and partially on the STI feature. In another embodiment, the gate stack 229 is formed in the device region 229 for a field-effect transistor (FET), such as a metal-oxide-semiconductor (MOS) transistor. The FET can be an n-type field-effect transistor (nFET) or a p-type field-effect transistor (pFET).

Figure 5:
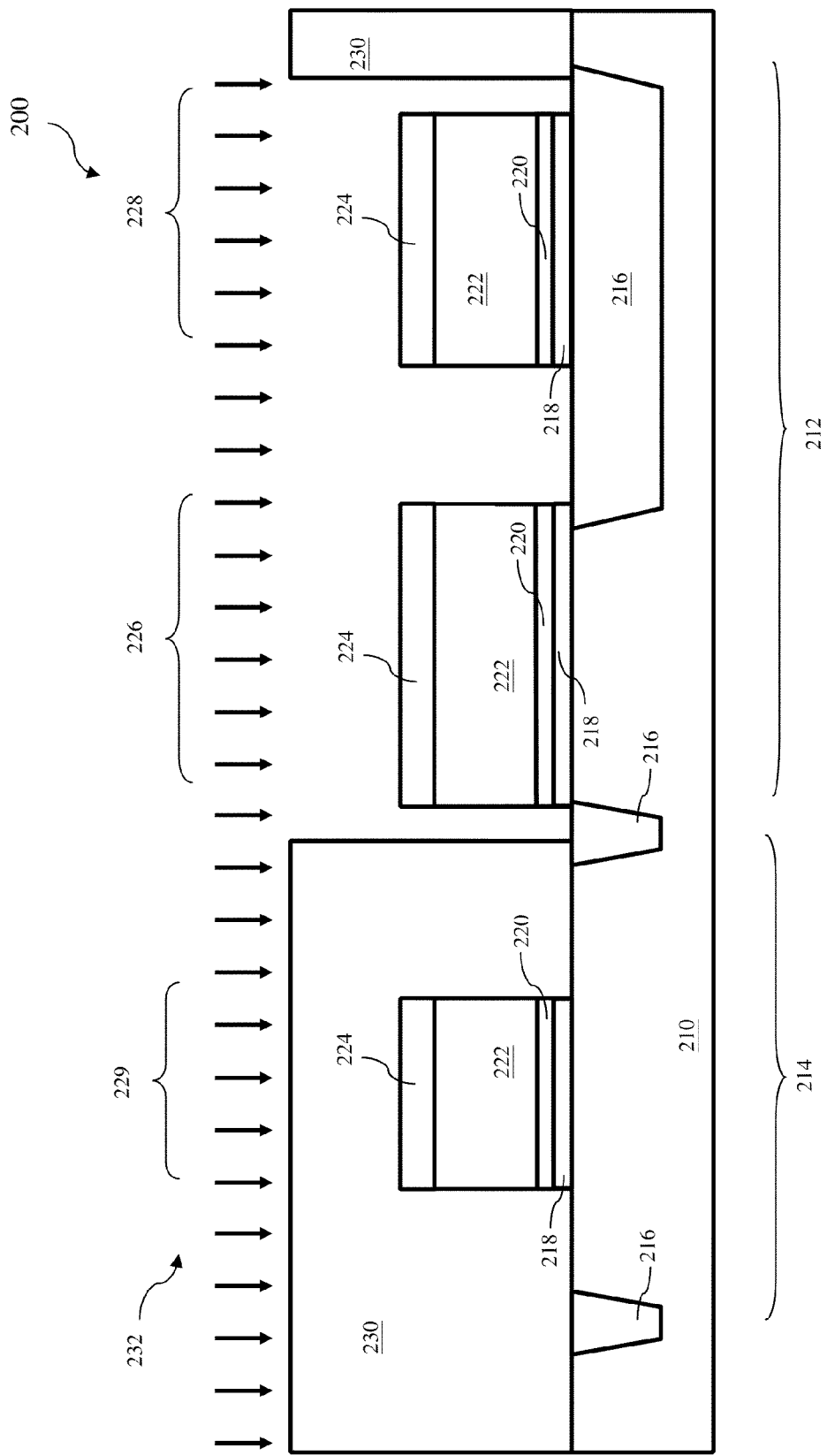

Referring to FIGS. 1 and 5, the method 100 proceeds to step 108 by performing a first ion implantation to introduce doping species into one or more resistors (e.g., 226 and 228), adjusting the resistance of the resistors. In one embodiment, a patterned photoresist layer 230 is formed on the substrate to cover the device region 214 while the resistor region 212 is exposed through the openings of the patterned photoresist layer 230. Then an ion implantation process 232 is applied to the resistor region 212 such that doping species are introduced into the resistors and effectively change the resistance thereof. The procedure to form the patterned photoresist layer 230 is similar to the procedure to form the patterned photoresist layer at step 106. The step 108 can be implemented in other alternative procedures to introduce the doping species. In one alternative embodiment, the hard mask layer 224 in the resistor region 212 within the opening of the patterned photoresist is removed and then the ion implantation process 232 is implemented to introduce the doping species directly to the resistors. In another alternative embodiment, the hard mask layer 224 in the resistor region 212 within the opening of the patterned photoresist is removed and then the patterned photoresist is removed by plasma ashing or wet stripping. Thereafter, a diffusion process is implemented to introduce the doping species to the resistors. As the hard mask layer 224 is removed from the resistors but remains on the gate stack, the diffusion can introduce the doping species to the resistors.

The ion implantation process 232 (or diffusion) uses a p-type doping species, such as boron (B), to be introduced into the resistors. Alternatively, other boron-containing doping species, such as boron-difluoride (BF2), is utilized. In the ion implantation process 232, the doping energy is adjusted according to the thickness of the resistors such that the doping species are uniformly distributed in the resistors from the top to the bottom. Alternatively, the doping energy is adjusted such that the doping species are distributed into a portion of the resistors. After subsequent annealing process, the doping species can be uniformly distributed in the resistors. The doping dose is tuned according to the thickness of the resistors and the designed resistivity or resistance of the resistors such that the final resistivity or resistance of the resistors is within the designed region. In one embodiment, the doping concentration of the resistors is below about $5 \times 10^{18}/cm^3$. When the thickness of the resistors is about or less than 1 micron, then the doping dose is less than about $1 \times 10^{14}/cm^2$.

Figure 6:
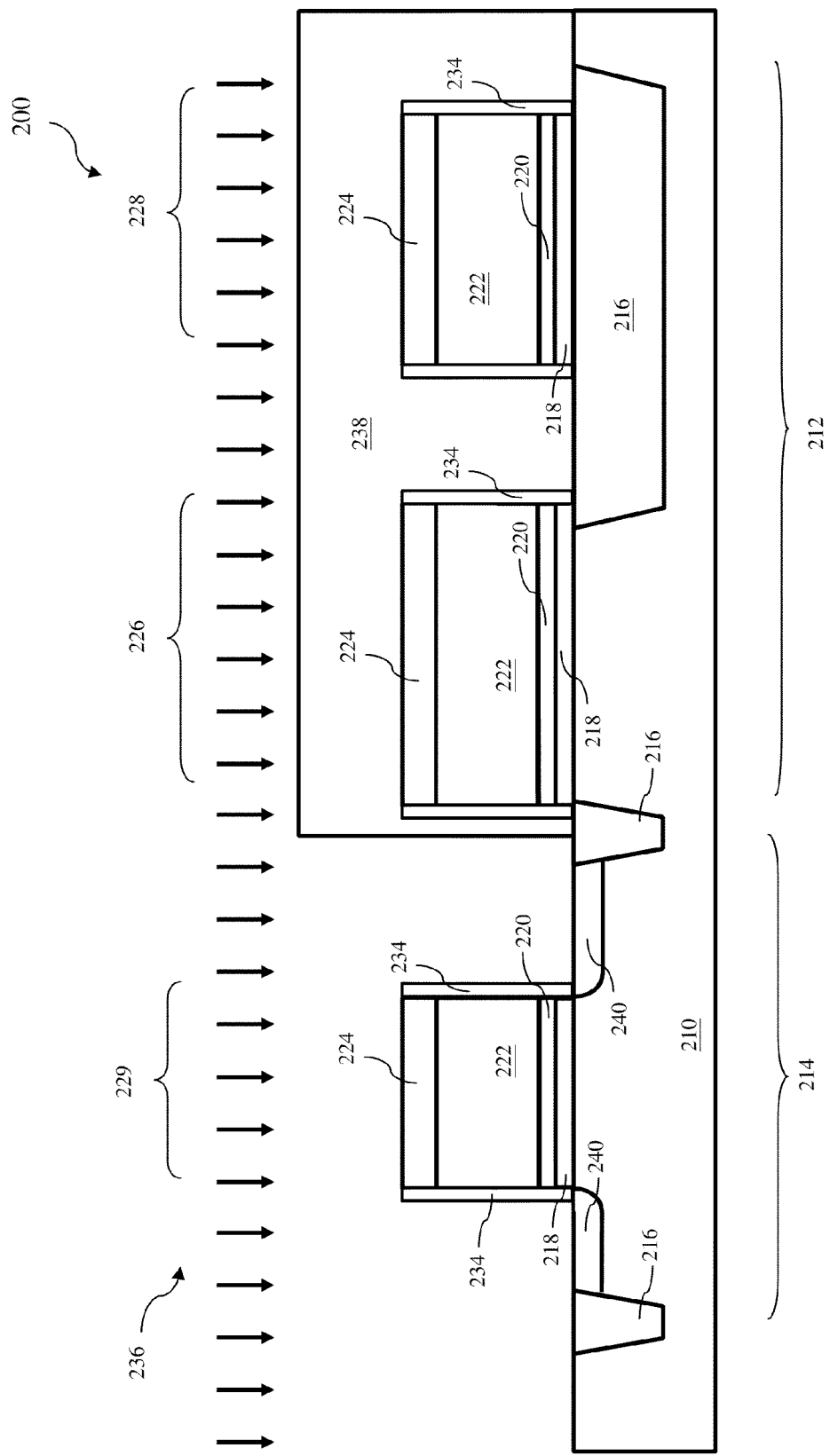

Referring to FIGS. 1 and 6, the method 100 may proceed to step 110 by forming source and drain regions 240 in the device region 214. In one embodiment, the source and drain regions 240 include light doped drain (LDD) regions and heavily doped source and drain (S/D) features, collectively referred to as source and drain regions, formed by one or more implantation processes 236. When the device region 214 includes both n-type FETs (nFETs) and p-type FETs (pFETs), the source and drain regions are formed, respectively, for the n-type FETs and the p-type FETs, using proper doping species. In one embodiment, taking n-type FETs as an example, the LDD features are formed by an ion implantation with a light doping dose. Thereafter, spacers 234 are formed by dielectric deposition and anisotropic etch, such as plasma etch. Then the heavily doped S/D features are formed by an ion implantation with a heavy doping dose. The various source and drain features of the p-type FETs can be formed in a similar procedure but with opposite doping type. The sidewall spacer 234 can be formed to the resistors in the process to form the spacers of nFETs and the pFETs. During various doping processes to form various source and drain features, the resistor region 212 is protected by a patterned photoresist layer, such as a patterned photoresist layer 238. In one embodiment of the procedure to form various source and drain features for both nFETs and pFETs, the LDD features of nFETs are formed by an ion implantation while the regions of pFETs and the resistors are covered by a patterned photoresist layer; the LDD features of pFETs are formed by an ion implantation while the regions of nFETs and the resistors are covered by another patterned photoresist layer; then spacers are formed to nFET gate stacks, pFET gate stacks and resistors by deposition and etch. the S/D features of nFETs are formed by ion implantation while the regions of pFETs and the resistors are covered by another patterned photoresist layer; and the S/D features of pFETs are formed by ion implantation while the regions of nFETs and the resistors are covered by another patterned photoresist layer. In one embodiment, a high temperature annealing process is followed to activate the various doping species in the source and drain regions and the resistors.

Figure 7:
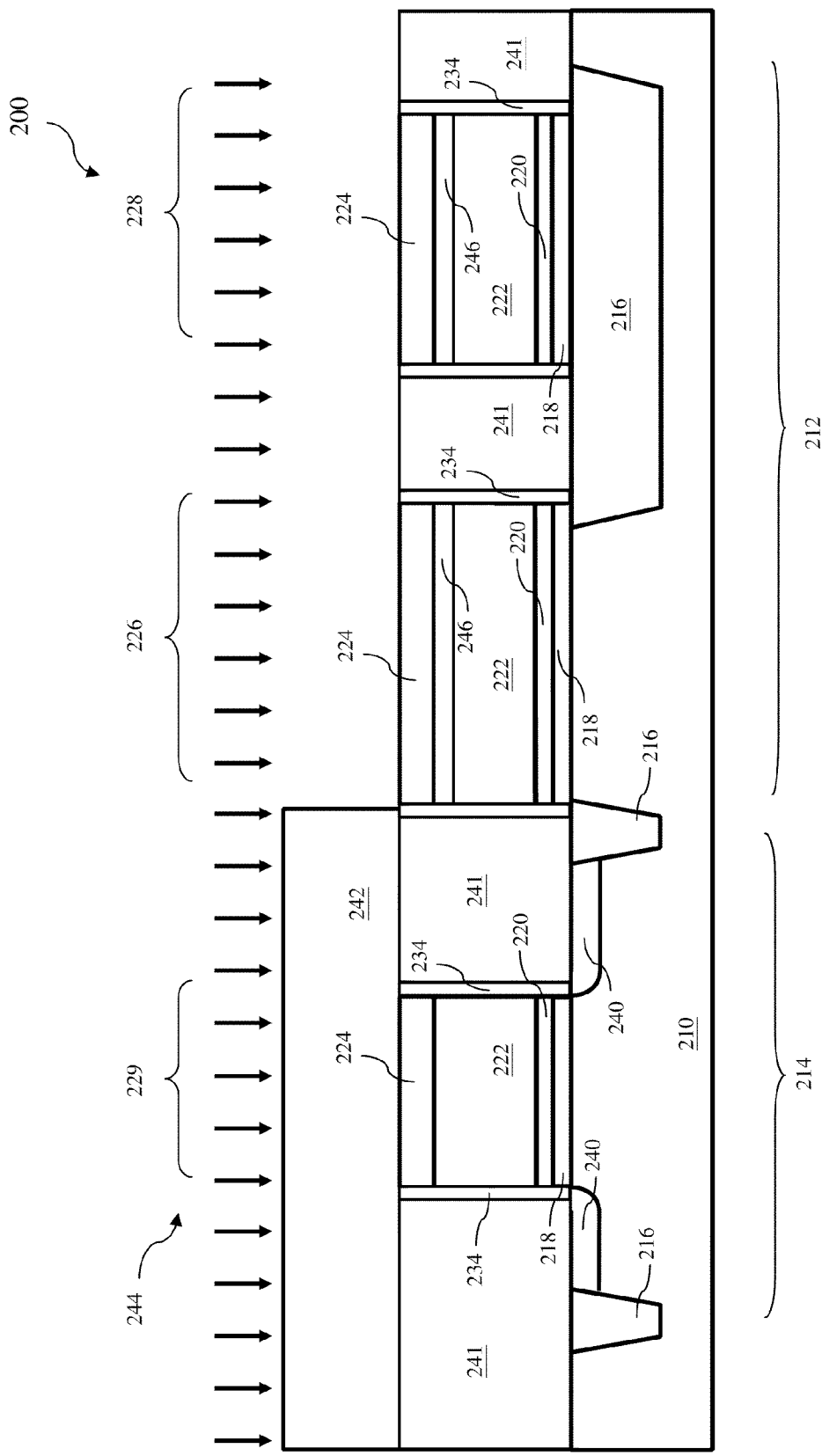

Referring to FIGS. 1 and 7, the method 100 proceeds to step 112 by performing a second ion implantation process 244 to the resistors to increase the etch resistance of the resistors in the resistor region 212. In one embodiment, an inter-level dielectric (ILD) layer 241 (also referred to as ILD0) is first formed on the semiconductor substrate 210. The ILD layer 241 includes silicon oxide, low k dielectric material, other suitable dielectric materials, or combinations thereof. The ILD layer 241 is formed by a suitable technique, such as CVD. For example, a high density plasma CVD can be implemented to form the ILD layer 241. In one embodiment, the ILD layer 241 deposits on the substrate 210, and fills in the gaps between the resistors in the resistor region 212 and the gates between the gate stacks in the device region 214. In furtherance of the embodiment, the ILD layer 241 is formed on the substrate to a level above the top surface of the resistors and the gate stacks.

A chemical mechanical polishing (CMP) process is applied to the ILD layer 241 to reduce the thickness of the ILD layer 241 such that the resistors and the gate stacks are exposed from the top side. The processing conditions and parameters of the CMP process, including slurry chemical and polishing pressure, can be tuned to partially remove and planarize the ILD layer 241.

Figure 10:
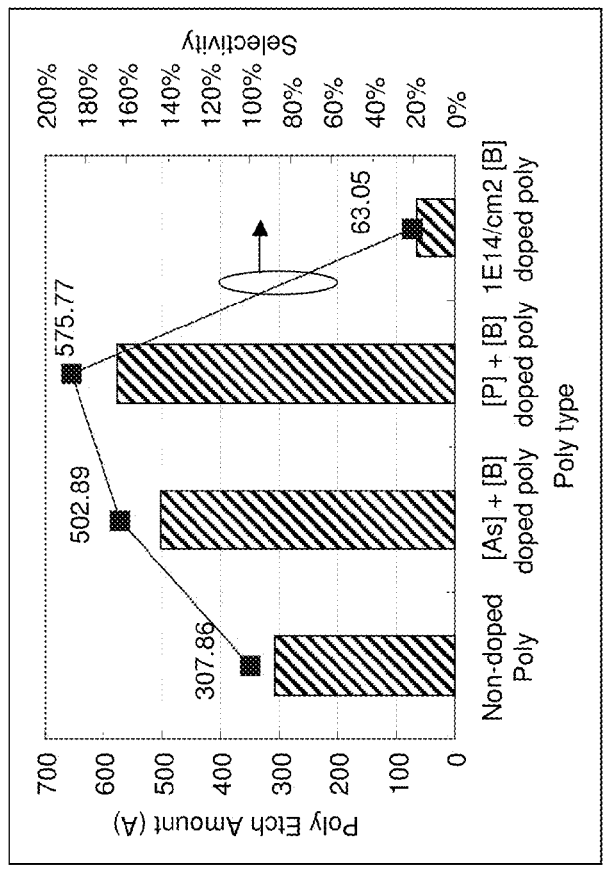
FIG. 10 is a bar chart illustrating etch rates over various doping procedures in various embodiments constructed according to various aspects of the present disclosure.

Then a patterned photoresist layer 242 is formed on the substrate 210 and covers the device regions. The patterned photoresist layer 242 includes one or more openings to expose the resistors in the resistor region 212. The second ion implantation process 244 uses a p-type doping species, such as boron, to be introduced into a top portion 246 of the resistors 226/228. Thus formed top portion 246 of the resistors is boron-containing and has a high resistance to an etchant used in subsequent etch process, such as the etch process to remove the dummy polysilicon (amorphous silicon) gates in the device region 214. Through various experiments, it is identified that the etch rate of polysilicon or amorphous silicon can be effectively and substantially decreased when boron is incorporated therein, as illustrated in FIG. 10. Alternatively, boron-difluoride is utilized for the second ion implantation is introduced to the top portion of the resistors. Other suitable dopant may be used to effectively increase the etch resistance of the resistors. The top portion 246 of the resistors has a thickness enough to protect the resistors during the subsequent etch process. In one embodiment, the top portion 246 has thickness less than about 5 nanometers. In the ion implantation process 244, the doping energy is adjusted to provide the proper thickness of the top portion 246.

Figure 11:
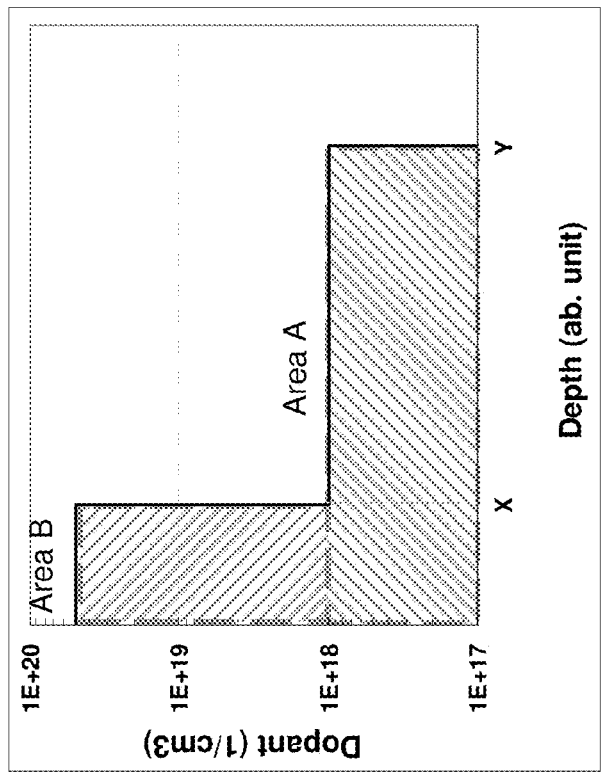
FIG. 11 is a diagram illustrating various doping profiles constructed according to various embodiments of the present disclosure.

The doping dose of the second ion implantation is tuned such that the doping concentration of the top portion 246 is greater than about $1\times10^{19}/cm^3$. In one embodiment, the doping concentration of the top portion 246 ranges between about $1\times10^{19}/cm^3$ and about $1\times10^{22}/cm^3$. In one embodiment, the doping dose is greater than about $1\times10^{14}/cm^2$. The patterned photoresist layer 242 is thereafter removed by a suitable process, such as plasma ashing or wet stripping. The first and second ion implantation processes 232 and 244 are designed to incorporate B or BF2 into the resistors with different profiles for different purposes. The first ion implantation process 232 is designed to introduce B or BF2 into the resistors with a uniform distribution to tune the resistance of the resistors. The second ion implantation process 244 is designed to introduce B or BF2 into only a top portion 246 of the resistors to reduce the etch rate of the resistors. The first doping concentration of the first ion implantation in the resistors is less than the second doping concentration of the second ion implantation in the top portion 246 of the resistors. FIG. 11 provides one example of the doping concentrations and depths of the first ion implantation (labeled as "area A") and the second ion implantation (labeled as "area B"}.

Figure 8:
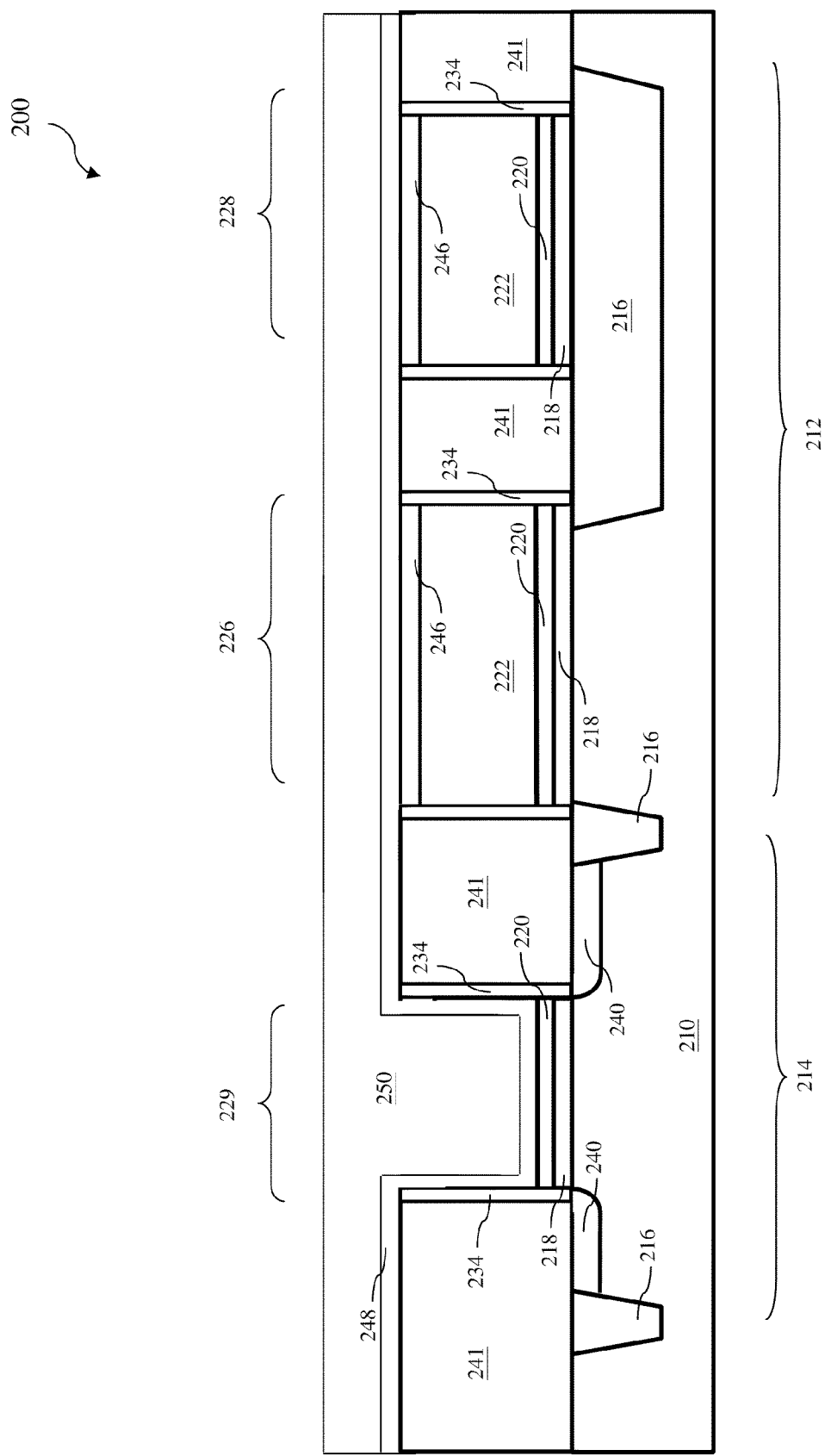
Figure 9:
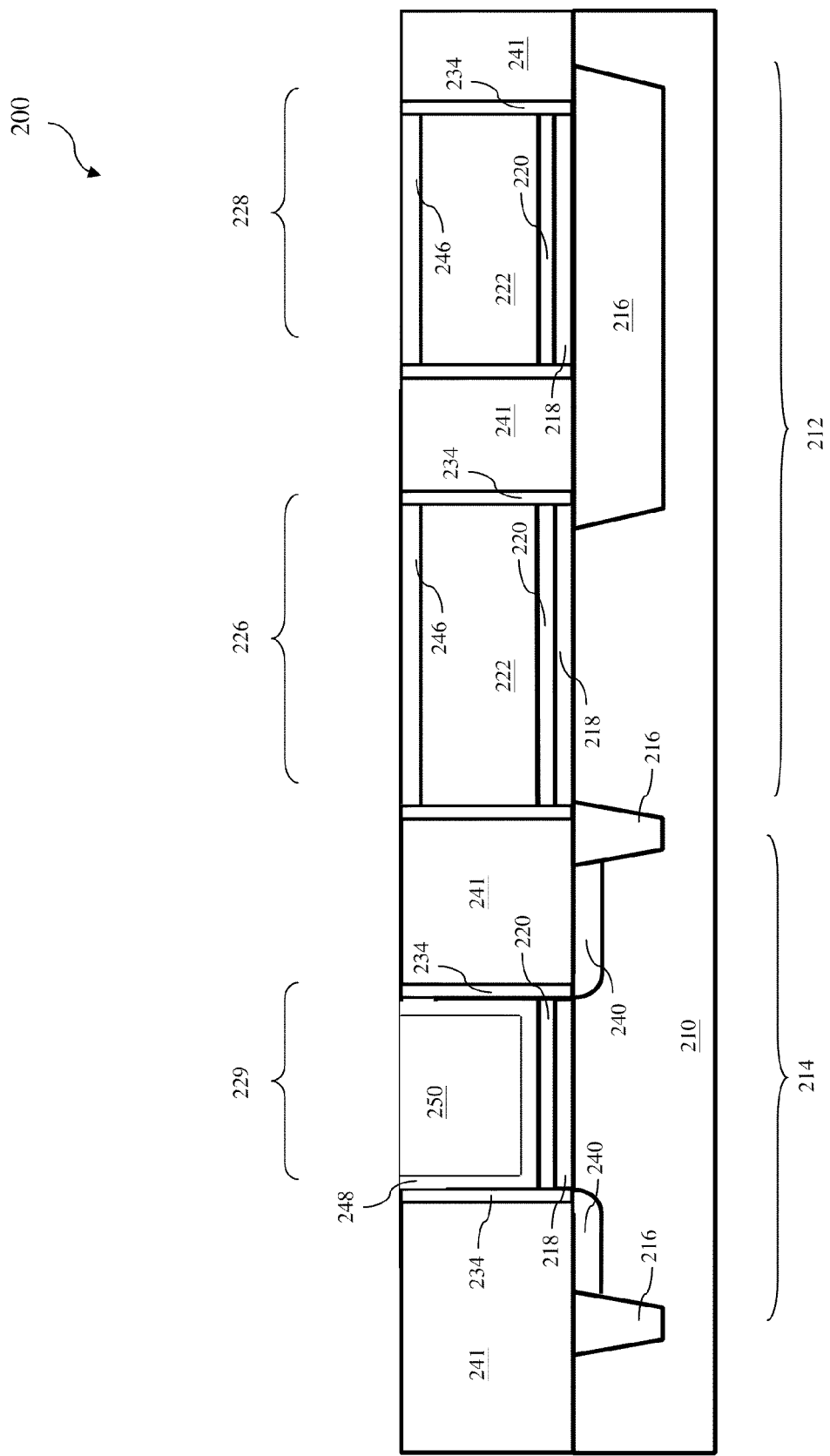

Referring to FIGS. 1, 8 and 9, the method 100 proceeds to step 114 by forming one or more metal gates in the device region 214. First, an etch process is applied to remove the polysilicon or amorphous silicon of the dummy gates within the device region 214. The etch process removes the hard mark player 224 as well. As the top portion 246 of the resistors has an increased etch resistance, the resistors in the resistor region 212 are effectively protected from removal by the etch process. Alternatively, the etch process includes two steps wherein the first step is designed to remove the hard mask layer 224 and the second step is designed to remove the silicon in the dummy gates of the device region 214 while the resistors are protected by the top portion 246. After the silicon in the dummy gates of the device region 214 is removed, trenches are formed in the region of the dummy gates and are referred to as gate trenches. In one embodiment, the etching process used to remove the polysilcion or amorphous silicon of the gate stacks in the device region 214 may implement suitable dry etching, wet etching or combinations thereof. In one example, an etching solution including HNO3, H2O and HF, or NH4OH solution, may be used to remove polysilicon (or amorphous silicon). In another example, chlorine (Cl)-based plasma may be used to selectively remove the polysilicon.

Then, one or more metal gate material layers are formed in the gate trenches. In one embodiment, a metal layer 248 having proper work function (referred to as a work function metal) and a conductive layer 250 is filled in the gate trench.

In one embodiment, the gate trench is deposited with a work function metal 248 and then is filled with the conductive material 250, forming a gate electrode for a pFET. The work function metal 248 for the pFET is referred to as a p-metal. The p-metal includes a metal-based conductive material having a work function compatible to the pFET. For one example, the p-metal has a work function of about or greater than about 5.2 eV. In one embodiment, the p-metal includes titanium nitride (TiN) or tantalum nitride (TaN). In other embodiments, the p-metal include TiN, tungsten nitride (WN), tantalum nitride (TaN), or combinations thereof. The p-metal 248 may include various metal-based film as a stack for optimized device performance and processing compatibility. The p-metal layer can be formed by a suitable process, such as physical vapor deposition (PVD), CVD, ALD, PECVD, PEALD or spin-on metal. The conductive material 250 is thereafter substantially fills in the gate trench, as illustrated in FIG. 8. The conductive material 250 includes aluminum or tungsten according to various embodiments. The method to form the conductive material may include PVD, CVD, ALD, PECVD, PEALD or spin-on metal. Then, a CMP process may be applied to remove the excessive work function metal and the conductive material, forming the metal gate, as illustrated in FIG. 9.

Alternatively, the gate trench is deposited with a work function metal 248 of a n-metal and then is filled with the conductive material 250, forming a gate electrode for a nFET. The n-metal includes a metal-based conductive material having a work function compatible to the nFET. For one example, the n-metal has a work function of about or less than about 4.2 eV. In one embodiment, the n-metal includes tantalum (Ta). In another embodiment, the n-metal include titanium aluminum (TiAl), titanium aluminum nitride (TiAlN), or a combination thereof. In other embodiments, the n-metal include Ta, TiAl, TiAlN, or combinations thereof. The n-metal may include various metal-based film as a stack for optimized device performance and processing compatibility. The n-metal layer can be formed by a suitable process, such as PVD. Then, a CMP process may be applied to remove the excessive work function metal and the conductive material. In one embodiment, the device region 214 includes both nFETs and pFETs. In this case, the metal gates are formed for the nFETs and pFETs, respectively by a proper procedure. For example, after the removal of the silicon from the dummy gates in the device region, the metal gates for the pFETs are formed by a deposition for the p-metal layer, a deposition for the conductive layer and a CMP process to remove the excessive p-metal layer and the conductive layer while the nFETS are protected by a patterned photoresist layer. Then the metal gates for nFETs are formed by a deposition for the n-metal layer, a deposition for the conductive layer, and a CMP process to remove the excessive n-metal layer and the conductive layer. Alternatively, a p-metal layer is deposited for the pFETs while the nFETs are protected by a patterned photoresist layer. A n-metal layer is deposited for the nFETs while the pFETs are protected by another patterned photoresist layer. Then a conductive layer is deposited to fill gate trenches for both nFETs and pFETs. A CMP process is applied to the substrate to remove the excessive portion of the n-metal layer, p-metal layer, and conductive layer, forming the metal gates for both nFETs and pFETs.

Figure 12:
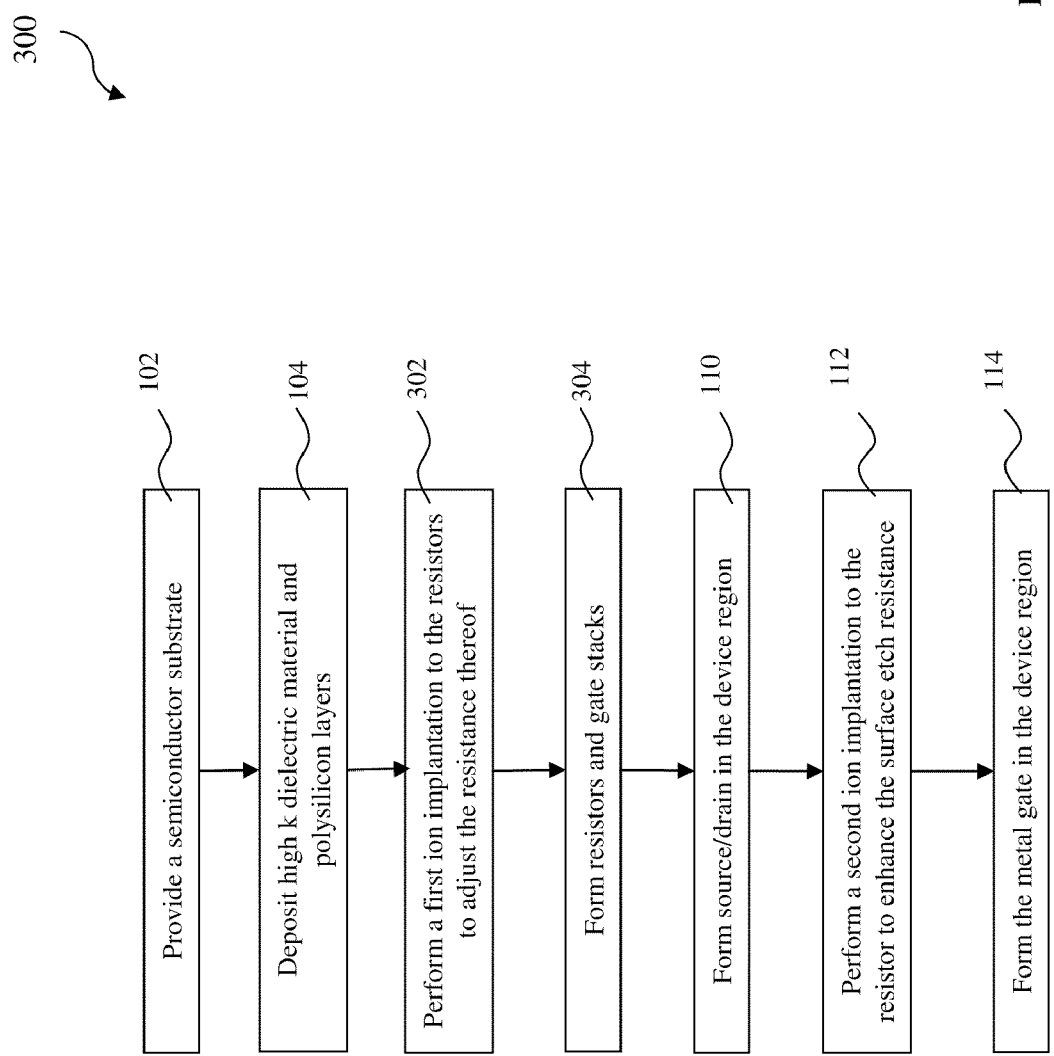
FIG. 12 is a flowchart of a method making a semiconductor device having a metal gate stack and a polysilicon resistor constructed according to various aspects of the present disclosure in another embodiment.
Figure 13:
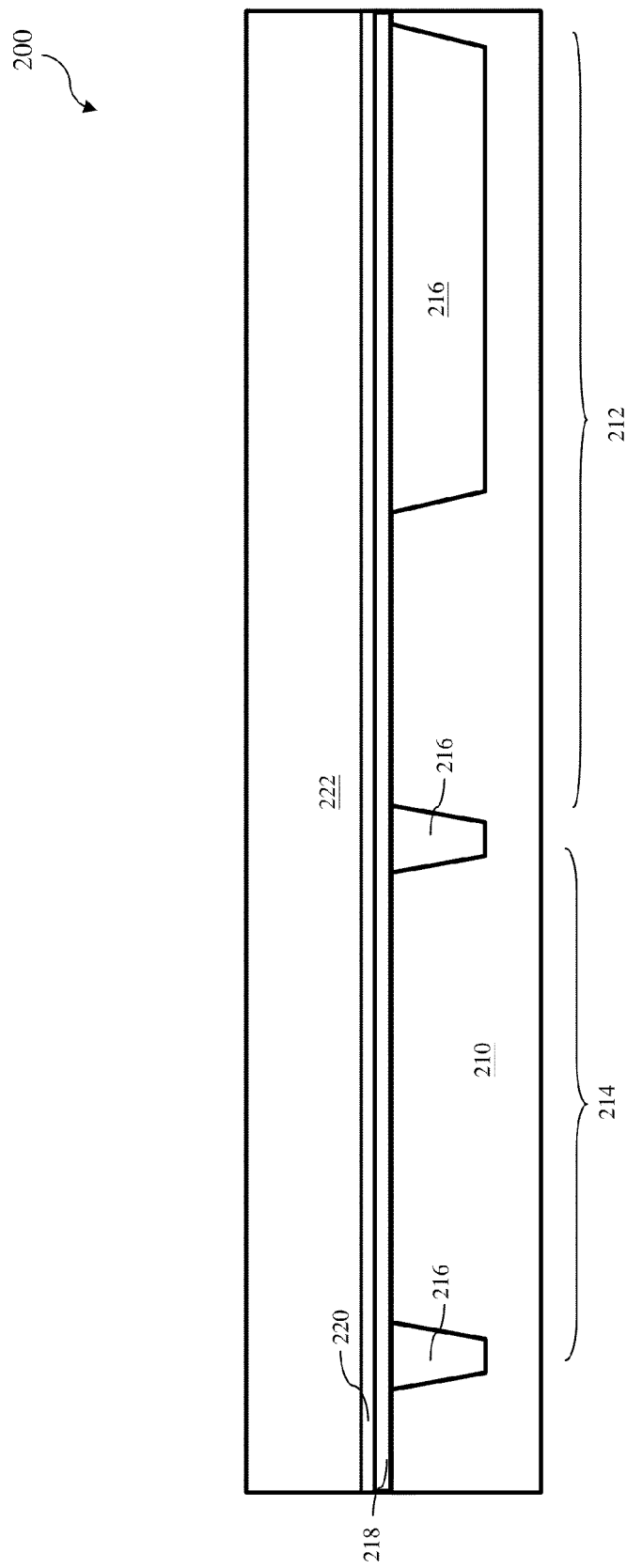
FIGS. 13-15 are sectional views of a semiconductor structure having a metal gate stack and a polysilicon resistor at various fabrication stages constructed according to various aspects of the present disclosure in another embodiment.
Figure 14:
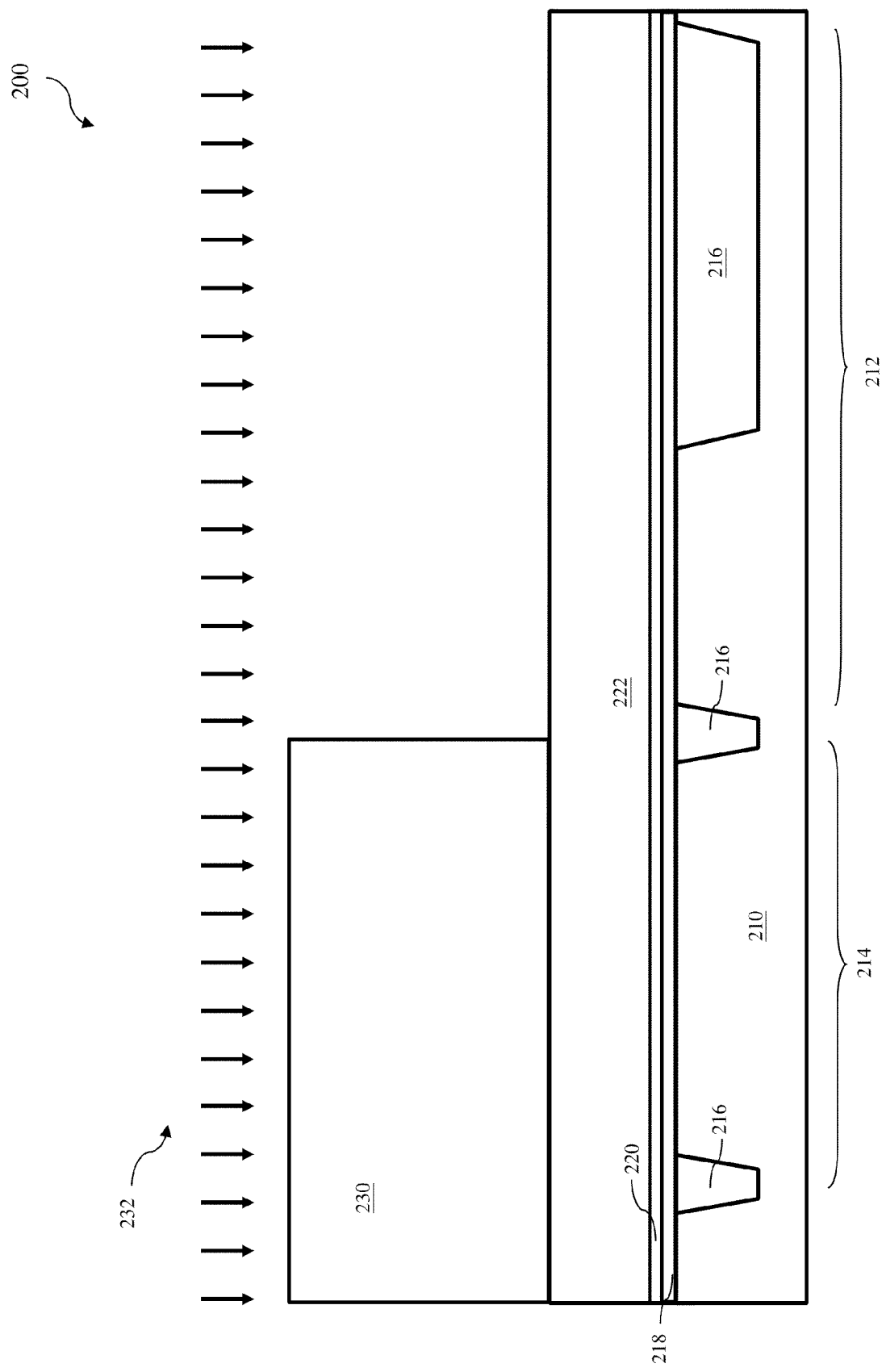
Figure 15:
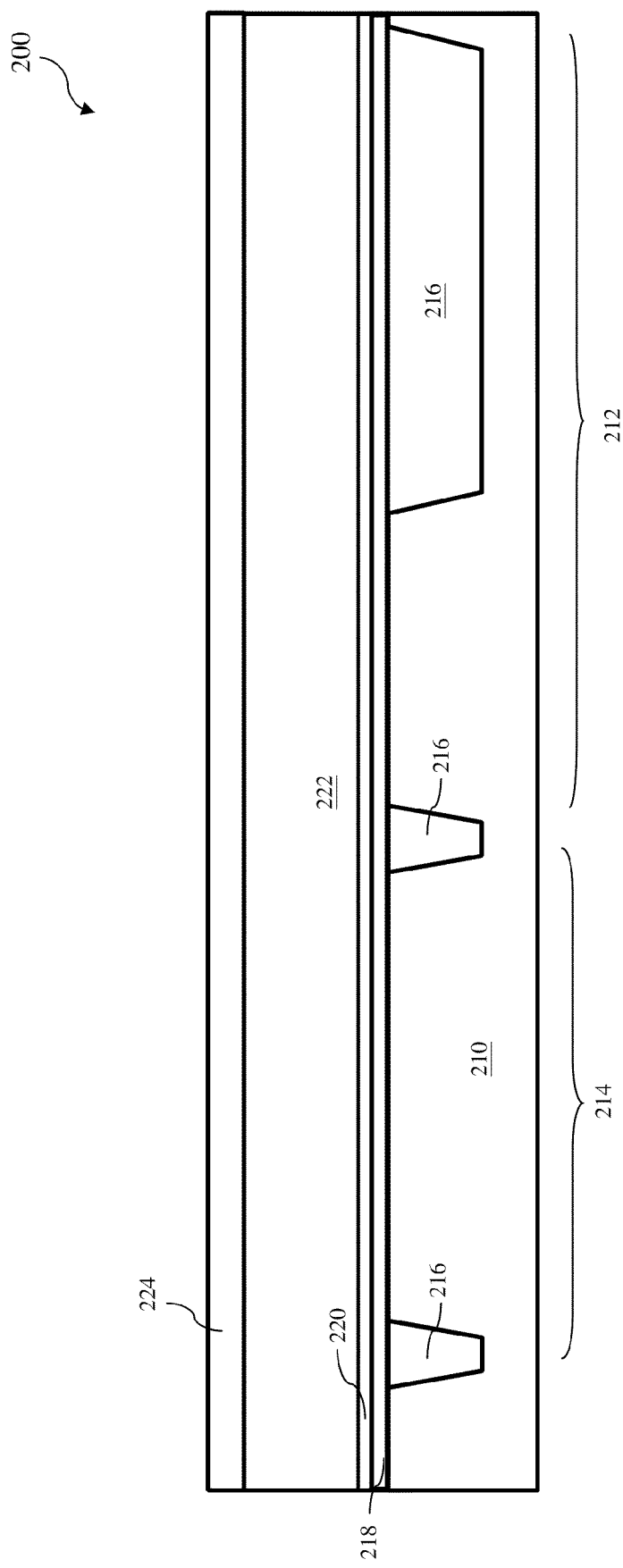

FIG. 12 is a flowchart of a method 300 for making a semiconductor device having a metal gate stack and a polysilicon resistor constructed according to various aspects of the present disclosure in another embodiment. FIGS. 13-15 are sectional views of a semiconductor structure having a metal gate stack and a polysilicon resistor at various fabrication stages constructed according to various aspects of the present disclosure in another embodiment. The method 300 is substantially similar to the method 100 of FIG. 1 except for the first ion implantation 232 to the resistor(s) in the resist region 212 at step 108 of FIG. 1 is implemented before the forming the gate stacks and the resistors at step 106 of FIG. 1. In this embodiment, the hard mask layer 224 is formed on the polysilicon layer 222 after the first implantation 232. In another embodiment, the polysilicon layer 222 is doped with boron by an in-situ process. For example, the polysilicon layer 222 is formed with in-situ boron dopant. The method 300 is further described below with reference to FIGS. 12, 2, 13-15, 4, and 6-9.

The method 300 includes providing a semiconductor substrate 210 at step 102 as illustrated in FIG. 2. The method 300 then proceeds to step 104 by forming high k dielectric material layer 218 and polysilicon layer 220 on the semiconductor substrate 210 as illustrated in FIG. 13. The hard mask layer is not formed on the polysilicon layer 220 at this stage. The method 300 proceeds to step 302 by performing the first ion implantation 232 as illustrated in FIG. 14. More particularly, the patterned photoresist layer 230 is formed on the polysilicon layer 222 and covers the device region 214. The first ion implantation 232 is applied to the polysilicon layer 222 in the resistor region 212 using the patterned photoresist layer 230 as an implant mask.

Thereafter, the method 300 proceeds to step 304 by forming the resistors and the gate stacks. First, the hard mask layer 224 is formed on the polysilicon layer 222 after the first ion implantation as illustrated in FIG. 15. Finally, a patterning process is implemented to the gate material layers to form one or more resistors, such as resistors 226 and 228, and one or more gate stacks (or dummy gates), such as a gate stack 229, as illustrated in FIG. 4. The patterning process at this step is substantially similar to the patterning process at step 106 of FIG. 1.

Thereafter, the method 300 proceeds to step 110 by forming source and drain features in the device region 214 by the ion implantation 236, as illustrated in FIG. 6. Afterwards, the method 300 is similar to the method 100 of FIG. 1. Particularly, the method 300 proceeds to steps 112 by performing the second ion implantation 244, as illustrated in FIG. 7; and step 114 by forming the metal gate in the device region 214 as illustrated in FIGS. 8 and 9.

Although not shown, other alternatives and features may present and other processing steps may present to form various features. In one embodiment, the one or more resistors (such as 226, 228 or both) in the resistor region 212 can be properly configured and alternatively used as a polysilcion fuse (or amorphous silicon fuse) for other applications. In another embodiment, the resistors are configured as an array, each being disposed on the shallow trench isolation (STI) 216 and adjacent passive devices being separated by active regions. The semiconductor structure 200 is a portion of an integrated circuit having both plurality of resistors and various field effect transistors each with a gate stack of high k dielectric and metal electrode. In another embodiment, the polysilicon layer 222 can be in-situ boron doped. In furtherance of the embodiment, the in-situ doping is tuned to achieve an expected resistivity of the polysilicon layer 222 so the first ion implantation 232 can be eliminated.

The first ion implantation (step 108 of FIG. 1) to introduce doping species to the resistors for adjusting the resistance of the resistor can be implemented in a different sequence. In one embodiment, the first ion implantation is performed before the patterning of the polysilicon layer 222. Referring to FIG. 1, the first ion implantation is implemented after the deposition of the polysilicon layer at step 104 and before patterning to form resistors and gate stacks at step 106. In a detailed description with further reference to FIG. 3, after the deposition of the polyslicon layer 222 and the hard mask layer 224, the first ion implantation is performed to introduce the doping species to the polysilicon layer. In a more particular embodiment with reference to FIG. 3, after the deposition of the polysilicon layer 222 and the hard mask layer 224, a patterned photoresist layer is formed on the hard mask layer 224 that includes one or more openings defined in the resistor region 212 while the device region 214 is covered by the patterned photoresist layer. Then the first ion implantation is applied to the semiconductor structure 200 using the patterned photoresist as an ion implant mask. The first ion implantation process in this embodiment is substantially similar to the first ion implantation at step 108 of FIG. 1.

In another embodiment, the p-metal layer and n-metal layer are formed in different order such that n-metal layer is formed first and the p-metal layer is formed thereafter. In another embodiment, a pFET has a strained structure for enhanced carrier mobility and improved device performance. In furtherance of the embodiment, silicon germanium (SiGe) is formed in the source and drain regions of the pFET to achieve a proper stress effect. In one example of forming such a strained pFET, the silicon substrate within the source and drain regions of the pFET are recessed by one or more etching step. Then SiGe is epi grown in the recessed regions and heavy doped source and drain are formed in the epi grown SiGe features. In another example, a dummy spacer is formed after the formation of the LDD features. The dummy spacer is removed after the formation of the SiGe features. Then a main spacer is formed on the sidewalls of the associated gate stack, with a different thickness such that the heavy doped source and drain have an offset from the SiGe features. For instance, the main spacer is thicker than the dummy spacer such that the heavy doped source and drain are formed in the SiGe features.

In another embodiment, a nFET has a strained structure for enhanced carrier mobility and improved device performance. In furtherance of the embodiment, silicon carbide (SiC) is formed in the source and drain regions of the nFET to achieve a proper stress effect at step 104. The strained nFET can be formed similarly as the strained pFET is formed. In another embodiment, the n-metal and p-metal layers each may include other proper metal or metal alloy. In another embodiment, the n-metal and p-metal layers each have a multi-layer structure to have an optimized work function and reduced threshold voltage.

Other processing steps may be implemented before, during and/or after the formation of the resistors (e.g. 226 and 228), the nFETs, and the pFETs. For example, the multilayer interconnection are further formed after the step 114. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

In one example, the high k dielectric layer can be formed by other suitable process such as metal organic chemical vapor deposition (MOCVD), or molecular beam epitaxy (MBE). In one embodiment, the high k dielectric material includes HfO2. In another embodiment, the high k dielectric material includes Al2O3. Alternatively, the high k dielectric material layer includes metal nitrides, metal silicates or other metal oxides. In another example, the interfacial layer 218, such as silicon oxide, is formed on the silicon substrate by a thermal oxidation, ALD, UV-Ozone Oxidation or other suitable method. In another example, a capping layer may be interpose between the high k dielectric layer and the n-metal (or p-metal) layer.

In an alternative embodiment, a high k dielectric material layer can be formed in the gate stack 229 of the device region 214 after the removal of the dummy polysilicon layer from the gate stack 229. For example, the dielectric material layer 218 formed at step 104 of FIG. 1 includes only silicon oxide layer as a dummy oxide layer, then the high k metal gate (HKMG) stack is formed by a high k last procedure where both a high k dielectric material layer and metal layer(s) are formed to fill the gate trench. Thus formed HKMG stack is also referred to as complete replacement gate. In furtherance of the present embodiment of the high k last procedure, the dummy polysilicon layer 220 and the dummy oxide layer 218 are removed from the gate stack 229, forming a gate trench in the device region 214. Then both the high k dielectric material layer and the metal layer(s) are formed in the gate trench. A CMP process may be applied thereafter to remove the excessive high k dielectric material layer and the metal layer(s) and planarize the surface of the semiconductor structure 200. In this case, the polysilicon layer of the resistors (226 and 228) in the resistor region 212 is directly on the silicon oxide layer. The high k dielectric material layer of the HKMG stack can be formed by other gate-last process (or partial replacement gate) or other high k last process.

In another example, the formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to etch back.

The various patterning process may include forming a patterned photoresist layer by a photolithography process. An exemplary photolithography process may include processing steps of photoresist spin-on coating, soft baking, mask aligning, exposing, post-exposure baking, developing photoresist and hard baking. The photolithography exposing process may also be implemented or replaced by other proper methods such as maskless photolithography, electron-beam writing, ion-beam writing, thermal lithography, and molecular imprint.

The present disclosure is not limited to applications in which the semiconductor structure includes a FET (e.g. MOS transistor) and a polysilicon resistor (or polysilicon fuse), and may be extended to other integrated circuit having a metal gate stack. For example, the semiconductor structures may include a dynamic random access memory (DRAM) cell, an imaging sensor, a capacitor and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of making an integrated circuit, the method comprising:
    forming a polysilicon layer on a substrate;
    patterning the polysilicon layer to form a polysilicon resistor and a polysilicon gate;
    forming a protective layer over the polysilicon gate;
    performing a first ion implantation to the polysilicon layer to adjust electric resistance of the polysilicon resistor, wherein the polysilicon gate is covered by the protective layer during performance of the first ion implantation;
    performing a second ion implantation to a top portion of the polysilicon resistor such that the top portion has an enhanced etch resistance; and
    performing an etch process to remove the polysilicon gate while the polysilicon resistor is protected by the implanted top portion.

2. The method of claim 1, further comprising forming a high-k dielectric material layer on the substrate.

3. The method of claim 1, wherein the performing the second ion implantation includes implanting the polysilicon resistor using one of boron (B) and boron fluoride (BF2).

4. The method of claim 1, wherein the performing the first ion implantation includes implanting the polysilicon resistor using one of BF2 and B.

5. The method of claim 1, wherein the performing the second ion implantation includes implanting doping species to the top portion having a thickness less than about 5 nm.

6. The method of claim 5, wherein the top portion of the polysilicon resistor includes boron as dopant with a doping concentration greater than about $10^{19}/cm^3$.

7. The method of claim 1, further comprising:
    forming source and drain in the substrate and interposed by the polysilicon gate;
    forming a metal layer in a gate trench formed after the performing an etch process;
    filling the gate trench with a conductive layer on the metal layer; and
    performing a chemical mechanical polishing process to remove excessive portions of the metal layer and the conductive layer.

8. The method of claim 7, wherein the source and drain are n-type dopant, and the metal layer has a work function less than 4.2 eV.

9. The method of claim 7, wherein the source and drain are p-type dopant, the metal layer has a work function greater than 5.2 eV.

10. The method of claim 1, wherein the performing a first ion implantation to the polysilicon layer includes performing the first ion implantation to the polysilicon layer before the patterning the polysilicon layer.

11. The method of claim 1, further comprising, after the performing a second ion implantation and before the performing an etch process:
    forming an inter-level dielectric (ILD) layer on the semiconductor substrate; and
    performing a first chemical mechanical polishing process to etch back the ILD layer.

12. A method comprising:
    forming a polysilicon resistor and a polysilicon gate on a semiconductor substrate;
    performing a first ion implantation to the polysilicon resistor to adjust electric resistance of the polysilicon resistor, wherein the polysilicon gate is covered by a first patterned material layer during performance of the first ion implantation;
    performing a second ion implantation to the polysilicon gate to form source and drain regions in the semiconductor substrate that are adjacent the polysilicon gate, wherein the polysilicon resistor is covered by a second patterned material layer during performance of the second ion implantation; and
    performing a third ion implantation to the polysilicon resistor such that a top portion of the polysilicon resistor has an enhanced etch resistance, wherein the polysilicon gate is covered by a third patterned material layer during performance of the third ion implantation.

13. The method of claim 12, wherein the first, second, and third material layers are different from each other.

14. The method of claim 12, wherein the first, second, and third ion implantations are different from each other.

15. The method of claim 12, wherein performing the first ion implantation includes implanting the polysilicon resistor using boron (B) and wherein performing the first ion implantation includes implanting the polysilicon resistor using boron fluoride (BF2).

16. The method of claim 12, wherein performing the second ion implantation to the polysilicon gate to form source and drain regions in the semiconductor substrate that are adjacent the polysilicon gate occurs after performing the first ion implantation and before performing the third ion implantation.

17. The method of claim 12, further comprising removing the first patterned material layer covering the polysilicon gate prior to performing the third ion implantation.

18. The method of claim 12, performing an etch process to remove the polysilicon gate while the polysilicon resistor is protected by the implanted top portion.

19. A method comprising:
    forming a polysilicon resistor and a polysilicon gate on a semiconductor substrate;
    forming a first patterned material layer over the polysilicon gate;
    performing a first ion implantation to the polysilicon resistor to adjust electric resistance of the polysilicon resistor, wherein the polysilicon gate is covered by the first patterned material layer during performance of the first ion implantation;
    forming a second patterned material layer over the polysilicon gate, the second patterned material layer being different than the first patterned material layer; and
    after forming the second patterned material layer over the polysilicon gate, performing a second ion implantation to the polysilicon resistor such that a top portion of the polysilicon resistor has an enhanced etch resistance, wherein the polysilicon gate is covered by the second patterned material layer during performance of the second ion implantation.

20. The method of claim 19, further comprising removing the first patterned material layer prior to performing the second ion implantation.

* * * * *